(12) United States Patent
Kavalieros et al.

(10) Patent No.: US 7,435,683 B2
(45) Date of Patent: Oct. 14, 2008

(54) APPARATUS AND METHOD FOR SELECTIVELY RECESSING SPACERS ON MULTI-GATE DEVICES

(75) Inventors: Jack T. Kavalieros, Portland, OR (US); Uday Shah, Portland, OR (US); Willy Rachmady, Beaverton, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 11/521,624

(22) Filed: Sep. 15, 2006

(65) Prior Publication Data

US 2008/0121998 A1    May 29, 2008

(51) Int. Cl.
*H01L 21/461* (2006.01)
(52) U.S. Cl. .............. 438/691; 438/267; 438/690; 438/694; 438/696; 438/699; 438/743; 438/744; 438/751; 438/756; 438/757; 438/759; 438/778; 438/787; 438/791; 257/900; 257/E21.626; 257/E21.64
(58) Field of Classification Search ............... 438/267, 438/690, 691, 694, 696, 699, 743, 744, 751, 438/756, 757, 759, 778, 787, 791; 257/900, 257/E21.626, E21.64
See application file for complete search history.

(56) References Cited

U.S. PATENT DOCUMENTS

| | | |
|---|---|---|
| 5,804,848 A | 9/1998 | Mukai |
| 5,844,278 A | 12/1998 | Mizuno et al. |
| 5,899,710 A | 5/1999 | Mukai |
| 6,018,176 A | 1/2000 | Lim |
| 6,066,869 A | 5/2000 | Noble et al. |
| 6,413,802 B1 | 7/2002 | Hu et al. |
| 6,459,123 B1 | 10/2002 | Enders et al. |
| 6,472,258 B1 | 10/2002 | Adkisson et al. |
| 6,525,403 B2 | 2/2003 | Inaba et al. |
| 6,562,665 B1 | 5/2003 | Yu |
| 6,583,469 B1 | 6/2003 | Fried et al. |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,657,259 B2 | 12/2003 | Fried et al. |
| 6,689,650 B2 | 2/2004 | Gambino et al. |
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |
| 6,800,910 B2 | 10/2004 | Lin et al. |
| 6,803,631 B2 | 10/2004 | Dakshina-Murthy et al. |

(Continued)

OTHER PUBLICATIONS

Y. Choi et al., "Sub-20nm CMOS FinFET Technologies", IEEE, 2001, pp. 19.1.1-19.1.4.

(Continued)

*Primary Examiner*—Thanh V Pham
(74) *Attorney, Agent, or Firm*—Kenneth A. Nelson; Intel Corporation

(57) ABSTRACT

Embodiments of an apparatus and methods for fabricating a spacer on one part of a multi-gate transistor without forming a spacer on another part of the multi-gate transistor are generally described herein. Other embodiments may be described and claimed.

13 Claims, 7 Drawing Sheets

U.S. PATENT DOCUMENTS

| | | | |
|---|---|---|---|
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |

OTHER PUBLICATIONS

J. Park et al., "Pi-Gate SOI MOSFET", IEEE Electron Device Letters, vol. 22, No. 8, Aug. 2001, pp. 405-406.

Willy Rachmady et al., "Tri-Gate Device With Conformal PVD Workfunction Metal on its Three-Dimensional Body and . . . ", U.S. Appl. No. 11/418,295, filed May 3, 2006.

Uday Shah et al., "A Sacrificial Oxide Layer Which Enables Spacer Over-ETCH in TRI-Gate Architectures", U.S. Appl. No. 11/479,713, filed Jun. 30, 2006.

APPARATUS AND METHOD FOR SELECTIVELY RECESSING SPACERS ON MULTI-GATE DEVICES

FIELD OF THE INVENTION

The field of invention relates generally to the field of semiconductor integrated circuit manufacturing and, more specifically but not exclusively, relates to CMOS (complementary metal oxide semiconductor) devices with a spacer on a first part of a multi-gate transistor and no spacer on a second part of the multi-gate transistor thereby increasing a transistor current.

BACKGROUND INFORMATION

In a conventional metal oxide semiconductor field effect transistor (MOSFET), the source, channel, and drain structures are constructed adjacent to each other within the same plane. Typically, a gate dielectric is formed on the channel area and a gate electrode is deposited on the gate dielectric. The transistor is controlled by applying a voltage to the gate electrode, thereby allowing a current to flow through the channel between source and drain.

An alternative to methods of building planar MOSFETs has been proposed to help alleviate some of the physical barriers to scaling down existing designs. The alternative method involves a construction of three dimensional MOSFETs, in the form of a multi-gate transistor such as a dual-gate field effect transistor (FinFET) or a tri-gate transistor, as a replacement for the conventional planar MOSFET.

Three-dimensional transistor designs such as the dual-gate FinFET and the tri-gate transistor allow tighter packing of the same number of transistors on a semiconductor chip by using vertical or angled surfaces for the gates. A tri-gate transistor comprises three equal length gates situated on three exposed surfaces of a body whereas a dual-gate transistor comprises two equal length gates situated along the sides of a narrow body.

An overall contact resistance of the tri-gate transistor is a function of a contact resistance contributed by the top gate and a contact resistance contributed by each of the two side gates. The contact resistance at each gate is determined in part by the contact area of the source and drain, materials used at the interface of the source and drain regions, such as a silicide layer, and the manner in which those materials interface. The silicide layer may be formed on the source and drain regions for the top and side gates of a multi-gate transistor to reduce the contact resistance, thereby increasing a transistor current. The contact resistance can increase when a portion of the silicide material is blocked or is otherwise prevented from contacting a source or drain region.

BRIEF DESCRIPTION OF THE DRAWINGS

The present invention is illustrated by way of example and not as a limitation in the figures of the accompanying drawings, in which.

DETAILED DESCRIPTION

Figure 1:
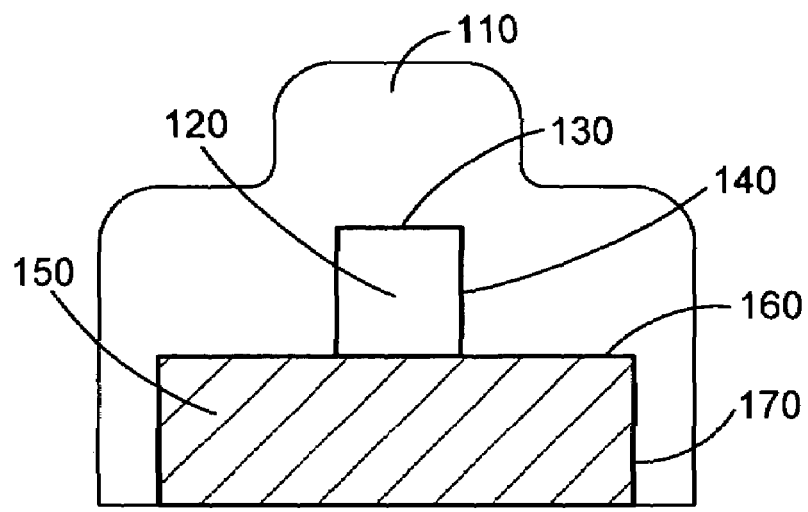
FIG. 1 is an illustration of a cross-sectional view of a multi-gate transistor after forming a first dielectric layer for a spacer.

An apparatus and method for increasing transistor current in a multi-gate device is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

There is a general need for maximizing the available contact area for the source drain regions in a multi-gate transistor. By increasing the area of contact in the source and drain regions and reducing the overall contact resistance, the transistor current for the multi-gate transistor can be increased. One embodiment of a method for fabricating a multi-gate transistor may comprise depositing a first dielectric or blanket layer for a spacer on a top surface and a side surface of a gate and a body. The first dielectric layer is planarized to expose the top surface of the gate. The first dielectric layer is eroded to reduce the thickness of the first dielectric layer and to expose the side surface of the gate. A second dielectric layer is deposited to create a spacer cap on the first dielectric, or blanket layer. The second dielectric layer is eroded to expose the top surface of the gate and to form the spacer cap on a portion of the first dielectric layer. The first dielectric layer is eroded to expose the top surface and the side surface of the body.

The illustration in FIG. 1 is a cross-sectional view of a multi-gate transistor after depositing a first dielectric layer 110 on a gate 120 and a body 150. The gate 120 may comprise a thin gate dielectric layer, a conductor such as doped or un-doped polysilicon, and a hard mask such as silicon nitride. In another embodiment, the gate 120 may comprise at least one of a thin gate dielectric layer and a conductor such as tungsten, tantalum, titanium and/or nitrides and alloys thereof. Alternatively, the gate 120 may comprise at least one of a thin gate dielectric layer and a conductor comprising both doped or un-doped polysilicon and a metal such as tungsten, tantalum, titanium and/or nitrides and alloys thereof. The thin gate dielectric layer may comprise at least one of an oxide or a high-K layer. The high-K layer may comprise at least one of lanthanum oxide, tantalum oxide, titanium oxide, hafnium oxide, zirconium oxide, lead-zirconate-titanate, barium-strontium-titanate, or aluminum oxide. The body 150 may comprise silicon, gallium arsenide (GaAs), or indium antimonide (InSb). The body 150 may be formed from a monocrystalline substrate or from a silicon-on-insulator (SOI) layer.

The first dielectric layer, or blanket layer 110 may comprise at least one of silicon oxide, silicon nitride, silicon oxynitride, hafnium oxide, or titanium oxide, but the embodiment is not so limited. The first dielectric layer 110 is deposited as a blanket layer on a top of the gate 130, a side of the gate 140, a top of the body 160, and a side of the body 170 using methods known to persons having ordinary skill in the art, such as plasma enhanced chemical vapor deposition (PECVD), high density chemical vapor deposition (HD-CVD), or sputtering.

Figure 2:
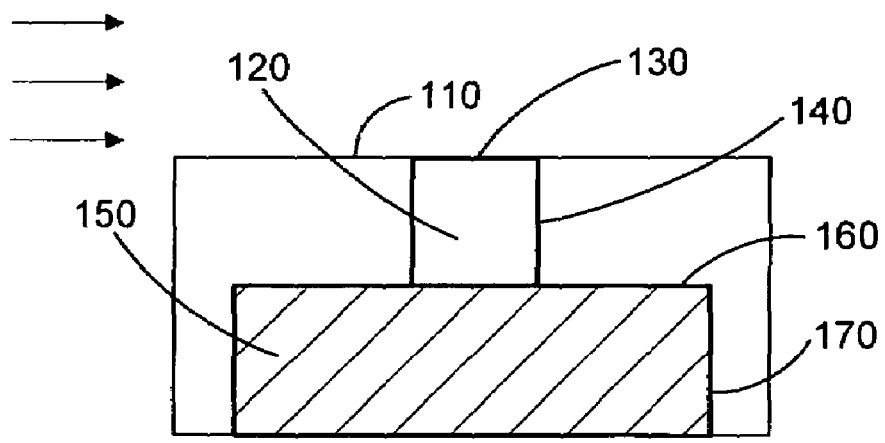
FIG. 2 illustrates the transistor in FIG. 1 after planarizing the first dielectric layer and exposing a top surface of a gate.

The illustration in FIG. 2 depicts the transistor in FIG. 1 after planarizing the first dielectric layer 110 and exposing the top of the gate 130. The first dielectric layer 110 is planarized, or polished using a process such as chemical mechanical planarization (CMP), though the embodiment is not so limited. The planarization process erodes a top portion of the dielectric material to create a uniform surface while improving the optical resolution of subsequent lithography steps. The planarization process may be terminated by detecting the presence of the top of the gate 130.

Figure 3:
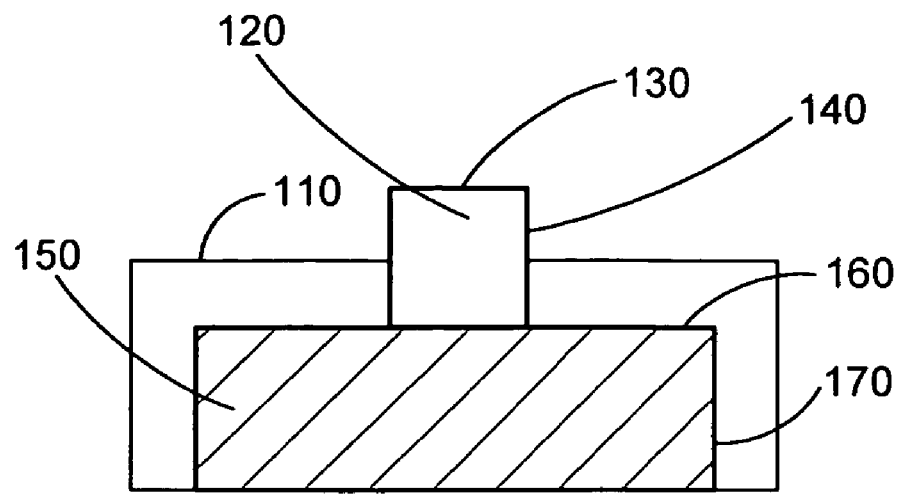
FIG. 3 illustrates the transistor in FIG. 2 after eroding a portion of the first dielectric layer to expose a side surface of the gate.

FIG. 3 illustrates the transistor in FIG. 2 after eroding a portion of the first dielectric layer 110 to expose a side surface of the gate 140. In one embodiment, the portion of the first dielectric layer 110 is removed anisotropically, meaning that an etch rate in the direction normal to a surface is much higher than in a direction parallel to the surface. The portion of the first dielectric layer 110 may be eroded using sulfur hexafluoride (SF6), oxygen (O2), carbon monoxide (CO), and argon (Ar), or a fluorinated hydrocarbon (CHxFy) gas in a magnetically enhanced reactive ion etch (MERIE) or an electron cyclotron resonance (ECR) chamber or tool. In another embodiment, the portion of the first dielectric layer 110 is eroded isotropically, meaning that a rate of etching is substantially the same in any direction and largely non-directional, which is typical of a wet-etch process. The appropriate wet-etch process is selectively designed to erode the first dielectric layer 110 without significantly eroding the top of the gate 130 or the side of the gate 140 and may comprise a hydrous hydrofluoric (HF) solution, a buffered HF solution or a hot phosphoric acid (H3PO4) solution.

Figure 4:
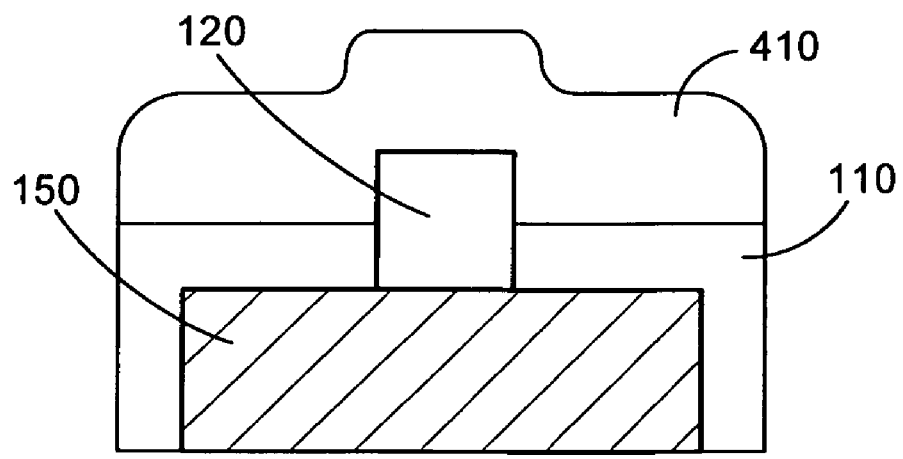
FIG. 4 illustrates the transistor in FIG. 3 after depositing a second dielectric layer for a spacer cap on the first dielectric layer.

FIG. 4 illustrates the transistor in FIG. 3 after depositing a second dielectric layer 410 for a spacer cap on the first dielectric layer 110. The second dielectric layer 410 may comprise at least one of silicon oxide, silicon nitride, silicon oxynitride, hafnium oxide, or titanium oxide, but the embodiment is not so limited. The second dielectric layer 410 is deposited as a blanket layer on the gate 120 and the first dielectric layer 110 using methods known to persons having ordinary skill in the art, such as plasma enhanced chemical vapor deposition (PECVD), high density chemical vapor deposition (HD-CVD), or sputtering.

Figure 5:
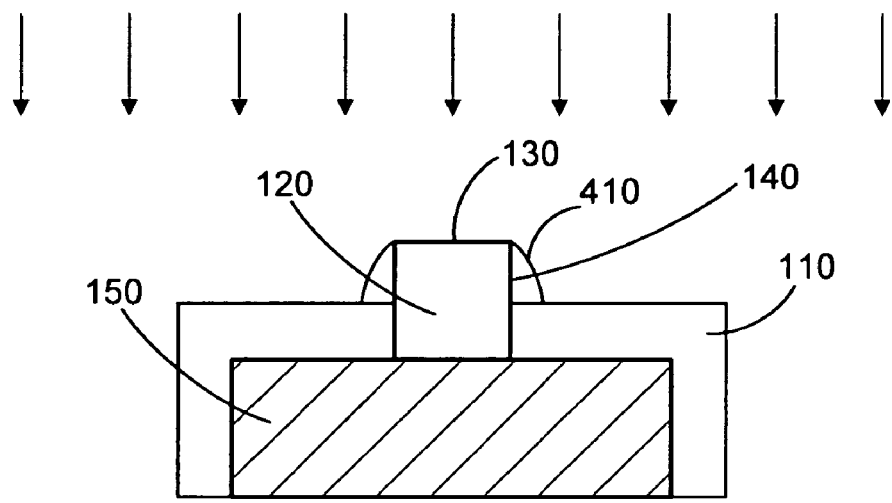
FIG. 5 illustrates the transistor of FIG. 4 after eroding a portion of the second dielectric layer to expose the top surface of the gate and to form the spacer cap on the first dielectric layer.

FIG. 5 illustrates the transistor of FIG. 4 after eroding a portion of the second dielectric layer 410 to expose the top surface of the gate 130 and to form a spacer cap on the first dielectric layer 110. The second dielectric layer 410 is eroded anisotropically using a dry-etch process such as sulfur hexafluoride (SF6), oxygen (O2), carbon monoxide (CO), and argon (Ar), or a fluorinated hydrocarbon (CHxFy) gas in a MERIE or an ECR chamber or tool. The dry-etch process may be terminated by using at least one of a timing mechanism or by sensing the presence of the first dielectric layer 110. A remaining portion of the second dielectric layer 410 will form a spacer cap on the side of the gate 140 and a top portion of the first dielectric layer 110 as a result of the erosion process, thereby shielding a top portion of the first dielectric layer 110 from subsequent anisotropic dry-etch processes.

Figure 6:
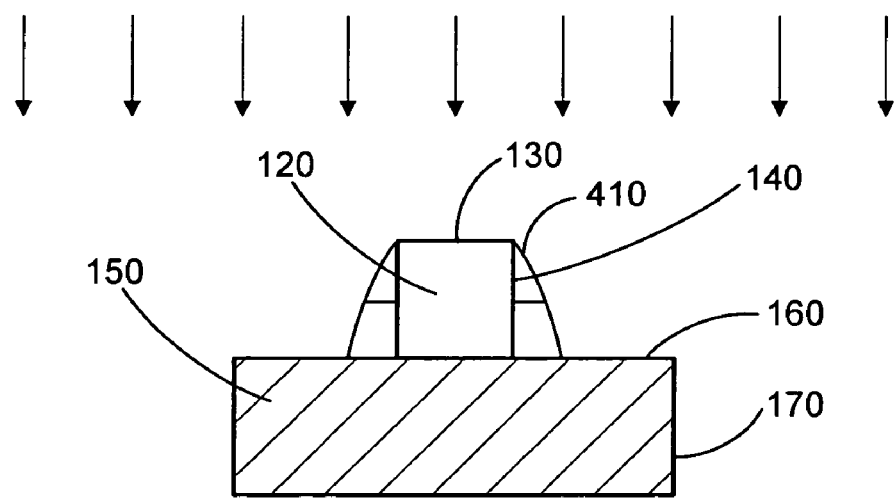
FIG. 6 illustrates the transistor of FIG. 5 after eroding the first dielectric layer to expose a top surface and a side surface of a body.

FIG. 6 illustrates the transistor of FIG. 5 after eroding the first dielectric layer 110 to expose the top of the body 160 and the side of the body 170. The first dielectric layer 110 is eroded anisotropically using a dry-etch process such as sulfur hexafluoride (SF6), oxygen (O2), carbon monoxide (CO), and argon (Ar), or a fluorinated hydrocarbon (CHxFy) gas in a MERIE or an ECR chamber or tool. The process for eroding the first dielectric layer 110 is selectively designed to erode the first dielectric layer 110 without significantly eroding the second dielectric layer 410 or the top of the gate 130, thereby exposing the top of the body 160 and the side of the body 170 while leaving a protective dielectric spacer on the side of the gate 140. The dielectric spacer may be used to help shield the channel from subsequent ion implantation steps while also protecting the side of the gate 140.

Figure 7:
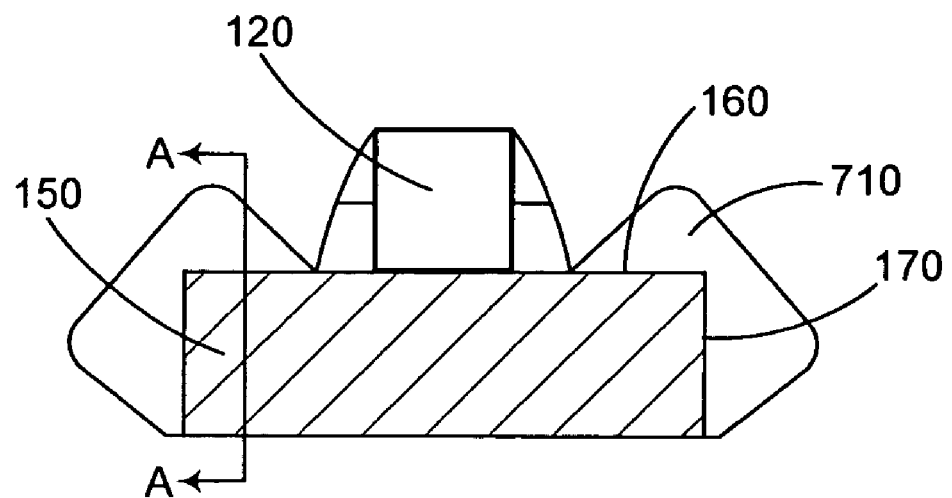
FIG. 7 illustrates the transistor of FIG. 6 after forming an epitaxial layer on the top surface and the side surface of the body.
Figure 7A:
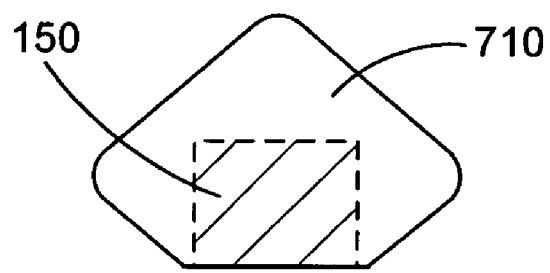
FIG. 7A is a cross-sectional view of the transistor of FIG. 7 taken through section line A-A of FIG. 7. This view illustrates the formation of the epitaxial layer on a front surface and a back surface of the body.

FIG. 7 illustrates the transistor of FIG. 6 after forming an epitaxial layer 710 on the top of the body 160 and the side of the body 170. The epitaxial layer 710 may be formed using a CVD chamber using a source gas such as silane, or by molecular beam epitaxy (MBE), though the embodiment is not limited in this respect. The illustration of FIG. 7A, a cross-section through section line A-A of FIG. 7, shows an embodiment with an epitaxial layer 710 formed on a front and a back of the body 150.

Figure 8:
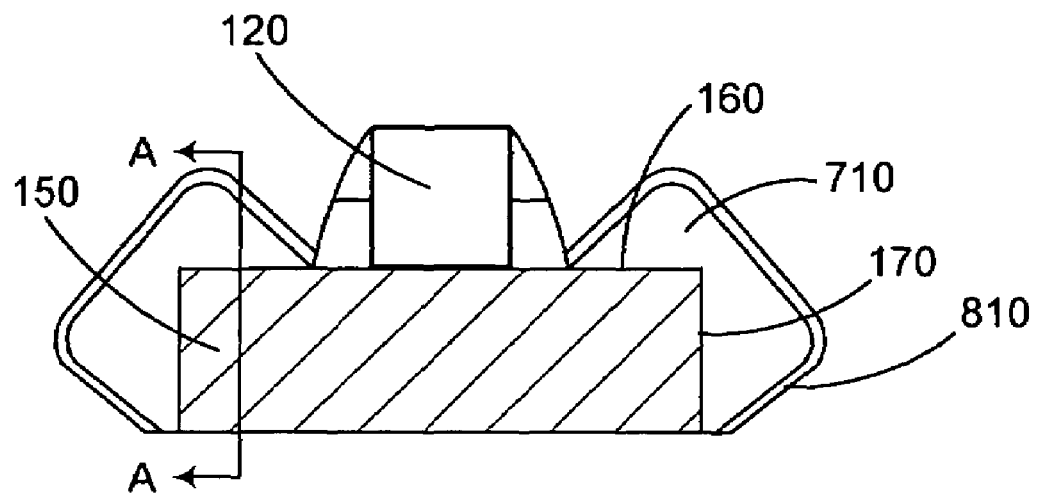
FIG. 8 illustrates the transistor of FIG. 7 after forming a silicide layer on the epitaxial layer on the top surface and the side surface of the body.
Figure 8A:
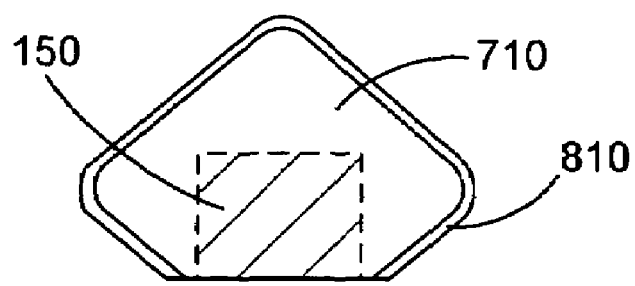
FIG. 8A is a cross-sectional view of the transistor of FIG. 8 taken through section line A-A of FIG. 8. This view illustrates the formation of a silicide layer on the epitaxial layer on the front surface and the back surface of the body.

FIG. 8 illustrates the transistor of FIG. 7 after forming a silicide 810 on the epitaxial layer 710. The silicide 810 may be formed on the exposed epitaxial layer 710 by depositing a metal such as titanium (Ti), cobalt (Co), nickel (Ni), or platinum (Pt) using a physical vapor deposition (PVD) technique or a chemical vapor deposition (CVD) technique, then etching, and heating with a subsequent high temperature process, although the scope of the embodiment is not limited in this respect. FIG. 8A is a cross-sectional illustration of section line A-A of FIG. 8, which shows one embodiment of a silicide layer 810 formed on a front and a back of the body 150 and the epitaxial layer 710.

Figure 9:
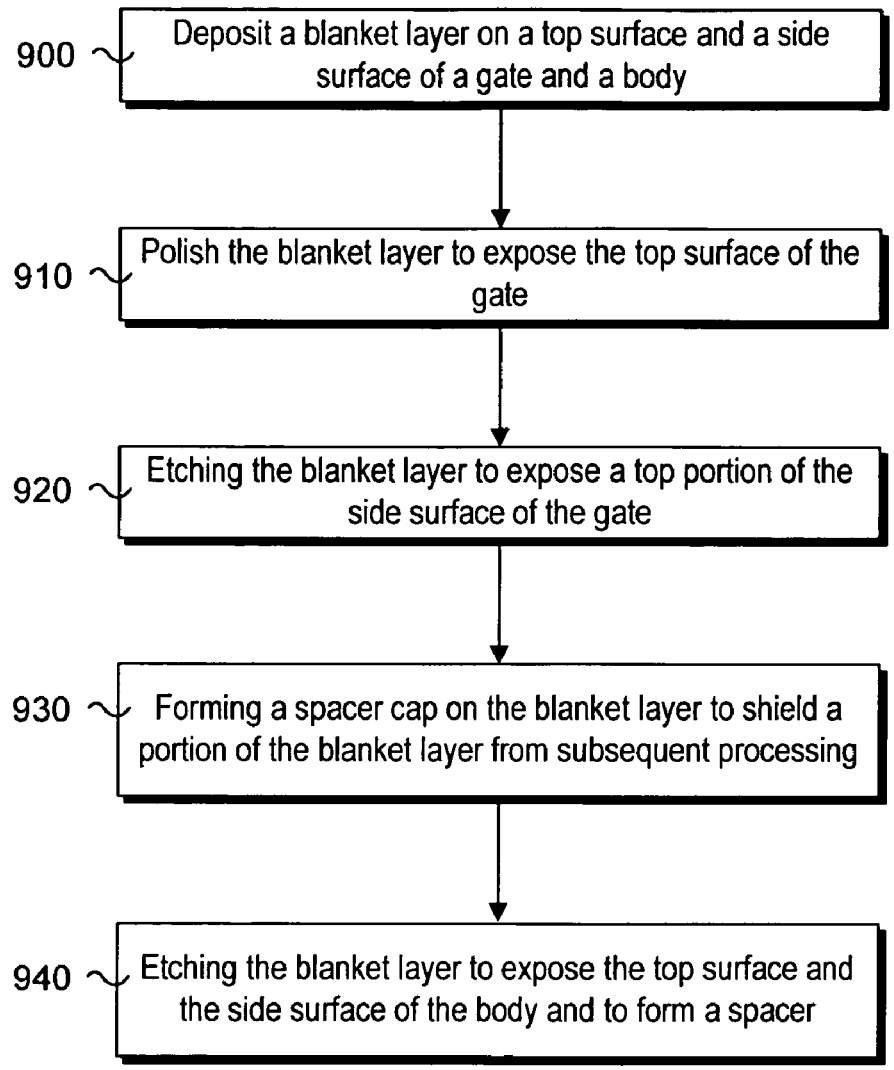
FIG. 9 is a flowchart describing one embodiment of a fabrication process used to form a spacer adjacent to a gate without forming a spacer adjacent to a body of a multi-gate transistor.

FIG. 9 is a flowchart describing one embodiment of a fabrication process used to form a spacer adjacent to a gate 120 without forming a spacer adjacent to a body 150 of a multi-gate transistor illustrated in FIG. 1 through FIG. 6. The process may be initiated (element 900) by depositing a blanket layer 110 on a top of a body 160, a side of a body 170, a top of a gate 130, and a side of the gate 140. The blanket layer 110 is polished (element 910) to create a nearly planar surface and to expose the top of the gate 130 using methods known to one skilled in the art. The blanket layer 110 is then etched (element 920) to expose a top portion of the side of the gate 140. In one embodiment, the dielectric layer may be eroded by a dry-etch process. In another embodiment, the dielectric material may be eroded using a wet-etch process or an ion milling process.

After etching a portion of the blanket layer 110, a spacer cap is formed on the blanket layer 110 by first depositing a second dielectric layer 410 on the blanket layer 110. The second dielectric layer 410 is then eroded to expose the top of the gate 130 and to form the spacer cap on the blanket layer 110. In one embodiment, the second dielectric layer 410 may be eroded by an anisotropic dry-etch process.

The blanket layer 410 is further etched (element 940) to expose the top of the body 160, the side of the body 170, and the top of the gate 130, while leaving a protective spacer adjacent to the side of the gate 140. FIG. 1 through FIG. 6 were used as possible embodiments to help describe the method.

Figure 10:
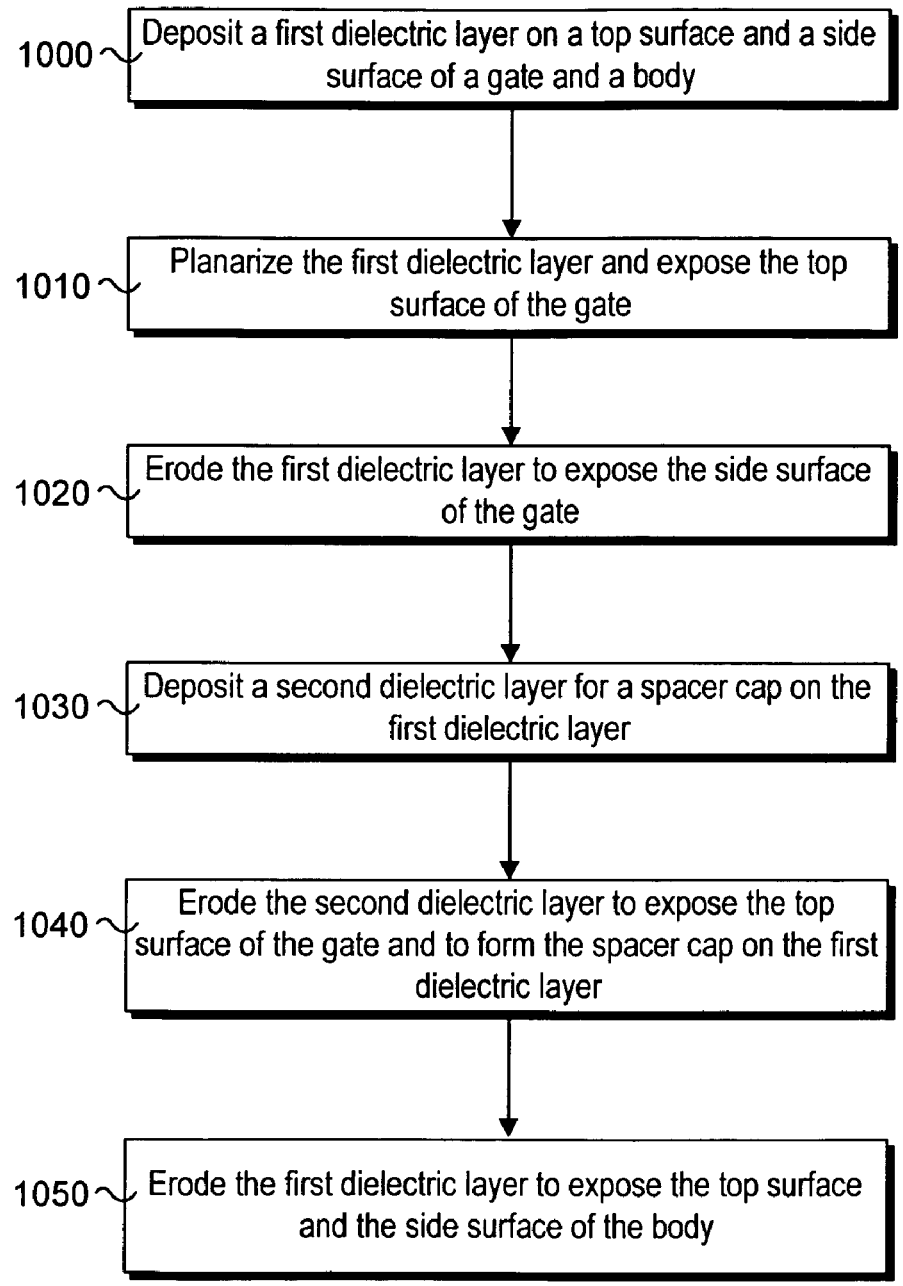
FIG. 10 is a flowchart describing another embodiment of a fabrication process used to form a spacer adjacent to a gate without forming a spacer adjacent to a body of a multi-gate transistor.

FIG. 10 is a flowchart describing another embodiment of a fabrication process used to form a spacer adjacent to a gate 120 without forming a spacer adjacent to a body 150 of a multi-gate transistor illustrated in FIG. 1 through FIG. 6. The process may be initiated (element 1000) by depositing a first dielectric layer 110 on a top of a body 160 and at least one side of a body 170. The first dielectric layer 110 is then polished (element 1010) to create a nearly planar surface and to expose a top of the gate 130. The first dielectric layer 110 is then eroded (element 1020) to expose a side of the gate 140. In one embodiment, the dielectric layer may be eroded by a dry-etch process. In another embodiment, the dielectric material may be eroded using a wet-etch process or an ion milling process.

After eroding the first dielectric layer 110, a second dielectric layer 410 is deposited (element 1030) on the first dielectric layer 110. The second dielectric layer 410 is then eroded (element 1040) to expose the top of the gate 130 and to form a spacer cap on the first dielectric layer 110. In one embodiment, the second dielectric layer 410 may be eroded by an anisotropic dry-etch process.

The first dielectric layer 410 is further eroded (element 1050) to expose the top of the body 160, the side of the body 170, and the top of the gate 130, while leaving a protective spacer adjacent to the side of the gate 140. FIG. 1 through FIG. 6 were used as illustrations to help describe the method.

A plurality of embodiments of a multi-gate transistor with an increased area of contact in the source and drain regions, which allows for increased transistor current, have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of fabricating a multi-gate transistor, comprising:
    depositing a first dielectric layer for a spacer on a top surface and side surfaces of a gate and a body;
    planarizing the first dielectric layer and exposing the top surface of the gate;
    eroding the first dielectric layer to reduce the thickness of the first dielectric layer over the body and to expose the side surfaces of the gate;
    depositing a second dielectric layer for a spacer cap on the first dielectric layer and the side surfaces of the gate;
    eroding the second dielectric layer to expose the top surface of the gate and to form the spacer cap on a portion of the first dielectric layer and adjacent to the side surfaces of the gate; and
    eroding the first dielectric layer to expose the top surface and the side surface of the body.

2. The method of claim 1, further including forming an epitaxial layer on the top surface and the side surfaces of the body.

3. The method of claim 2, further including forming a silicide layer on the epitaxial layer.

4. The method of claim 1, wherein the first dielectric layer is selected from the group consisting of silicon oxide, silicon nitride, silicon oxynitride, hafnium oxide, and titanium oxide.

5. The method of claim 1, wherein eroding the first dielectric layer includes using at least one of a dry-etch process and an ion milling process.

6. The method of claim 1, wherein the second dielectric layer is selected from the group consisting of silicon oxide, silicon nitride, silicon oxynitride, hafnium oxide, and titanium oxide.

7. The method of claim 1, wherein eroding the second dielectric layer includes using at least one of a dry-etch process and an ion milling process.

8. A method for fabricating a multi-gate transistor comprising:
- depositing a dielectric blanket layer on a top surface and side surfaces of a gate and a top surface and side surfaces of a body;
- polishing the dielectric blanket layer to expose the top surface of the gate;
- etching the dielectric blanket layer to expose a top portion of the side surfaces of the gate;
- forming a spacer cap adjacent to the top portion of the side surfaces of the gate; and
- etching the dielectric blanket layer to expose the top surface and the side surfaces of the body and to form a spacer.

9. The method of claim 8, further including forming an epitaxial layer on the top surface and the side surfaces of the body.

10. The method of claim 9, further including forming a silicide layer on the epitaxial layer.

11. The method of claim 8, wherein the dielectric blanket layer is selected from the group consisting of silicon oxide, silicon nitride, silicon oxynitride, hafnium oxide, and titanium oxide.

12. The method of claim 8, wherein eroding the dielectric blanket layer includes using at least one of a dry-etch process and an ion milling process.

13. The method of claim 8, wherein the spacer cap is selected from the group consisting of silicon oxide, silicon nitride, silicon oxynitride, hafnium oxide, and titanium oxide.

* * * * *